US012638474B2

(12) United States Patent
    Ahn et al.

(10) Patent No.: US 12,638,474 B2
(45) Date of Patent: May 26, 2026

(54) ELECTRICALLY CONDUCTIVE CONTACT PIN

(71) Applicant: POINT ENGINEERING CO., LTD., Chungcheongnam-do (KR)

(72) Inventors: Bum Mo Ahn, Gyeonggi-do (KR); Seung Ho Park, Gyeonggi-do (KR); Chang Hee Hong, Gyeonggi-do (KR)

(73) Assignee: POINT ENGINEERING CO., LTD., Chungcheongnam-do (KR)

( * ) Notice: Subject to any disclaimer, the term of this patent is extended or adjusted under 35 U.S.C. 154(b) by 182 days.

(21) Appl. No.: 18/275,217

(22) PCT Filed: Jan. 27, 2022

(86) PCT No.: PCT/KR2022/001448
     § 371 (c)(1),
     (2) Date: Aug. 1, 2023

(87) PCT Pub. No.: WO2022/169196
     PCT Pub. Date: Aug. 11, 2022

(65) Prior Publication Data
     US 2024/0094248 A1      Mar. 21, 2024

(30) Foreign Application Priority Data
     Feb. 5, 2021    (KR) ........................ 10-2021-0016483

(51) Int. Cl.
     G01R 1/067          (2006.01)
(52) U.S. Cl.
     CPC ..... G01R 1/06716 (2013.01); G01R 1/06733 (2013.01)
(58) Field of Classification Search
     CPC ........................ G01R 1/06733; G01R 1/06716
     See application file for complete search history.

(56) References Cited

U.S. PATENT DOCUMENTS 4,737,114 A * 4/1988 Yaegashi .............. H01R 12/585
                                                   439/82
9,702,904 B2 7/2017 Breinlinger et al.
                    (Continued)

FOREIGN PATENT DOCUMENTS

DE        102008023761        10/2012
DE        102017209510        12/2018
                    (Continued)

OTHER PUBLICATIONS

"International Search Report (Form PCT/ISA/210) of PCT/KR2022/ 001448", mailed on May 9, 2022, with English translation thereof, pp. 1-4.

(Continued)

*Primary Examiner* — Minh Q Phan
(74) *Attorney, Agent, or Firm* — JCIPRNET

(57)          ABSTRACT

An electrically conductive contact pin which prevents a fatigue fracture in a void part by distributing stress concentration in the void part is provided. The electrically conductive contact pin includes: a first surface; a second surface facing the first surface; a lateral surface for connecting the first surface and the second surface; and a void part formed inside the electrically conductive contact pin by passing through the first surface and the second surface along the length direction of the electrically conductive contact pin. The void part includes: a center void part; and an end void part communicating with the center void part and extending toward an end side of the electrically conductive contact pin, wherein the width of the end void part is narrower than the width of the center void part.

7 Claims, 10 Drawing Sheets

(56) References Cited

U.S. PATENT DOCUMENTS

| | | | |
|---|---|---|---|
| 2001/0015652 A1 | 8/2001 | Eldridge et al. | |
| 2006/0170440 A1 | 8/2006 | Sudin | |
| 2016/0154024 A1 | 6/2016 | Miyagawa | |
| 2018/0011126 A1* | 1/2018 | Acconcia | G01R 1/06733 |

FOREIGN PATENT DOCUMENTS

| | | |
|---|---|---|
| JP | 2012173263 | 9/2012 |
| JP | 2013007700 | 1/2013 |
| JP | 6457814 | 1/2019 |
| JP | 6642359 | 2/2020 |
| KR | 200397748 | 10/2005 |
| KR | 101712367 | 3/2017 |
| KR | 1020170129806 | 11/2017 |
| KR | 1020170132222 | 12/2017 |
| KR | 1020180057520 | 5/2018 |
| TW | 201522982 | 6/2015 |
| TW | 201632892 | 9/2016 |

OTHER PUBLICATIONS

"Office Action of Korea Counterpart Application", issued on Aug. 10, 2022, with English translation thereof, p. 1-p. 16.
"Office Action of Korea Counterpart Application", issued on Jan. 13, 2023, with English translation thereof, p. 1-p. 8.
"Office Action of Taiwan Counterpart Application", issued on Jul. 17, 2025, with English translation thereof, p. 1-p. 20.

* cited by examiner (a)            (b)

ELECTRICALLY CONDUCTIVE CONTACT PIN

CROSS-REFERENCE TO RELATED APPLICATION

This application is a 371 application of an international PCT application serial no. PCT/KR2022/001448, filed on Jan. 27, 2022, which claims the priority benefit of Korean application KR10-2021-0016483, filed on Feb. 5, 2021. The entirety of each of the above-mentioned patent applications is hereby incorporated by reference herein and made a part of this specification.

TECHNICAL FIELD

The present disclosure relates to an electrically conductive contact pin.

DESCRIPTION OF RELATED ART

A test for electrical characteristics of a semiconductor device is performed by approaching an object to be inspected (semiconductor wafer or semiconductor package) to an inspection apparatus having a plurality of electrically conductive contact pins and then bringing the electrically conductive contact pins into contact with corresponding electrode pads (or solder balls or bumps) on the object to be inspected. After the electrically conductive contact pins reach positions where they are brought into contact with the electrode pads on the object to be inspected, a process of further approaching the object to be inspected is performed. This process is called overdrive. Overdrive is a process that elastically deforms the electrically conductive contact pins. By overdrive, all electrically conductive contact pins can be reliably brought into contact with the electrode pads even when there is a height difference between the electrode pads or the electrically conductive contact pins. During overdrive, each electrically conductive contact pin is elastically deformed, and performs scrubbing while a front end of thereof moves on an electrode pad. By such scrubbing, an oxide film on a surface of the electrode pad can be removed and contact resistance can be reduced thereby.

In recent years, there has been a demand for developing an inspection apparatus such as a probe card which can transmit a signal having a frequency greater than 1 GHz. Here, when the length of an electrically conductive contact pin for transmitting signals having a frequency greater than 1 GHz is shortened to equal to or less than 10 mm, the inductance thereof can be reduced and high frequency characteristics of test signals can be improved. However, when an attempt is made to ensure a sufficient overdrive amount while reducing the length of the electrically conductive contact pin to equal to or less than 10 mm, there is a problem that the electrically conductive contact pin is plastically deformed during overdrive. In addition, there is another problem that the electrode pad is permanently damaged and broken.

Meanwhile, it may be considered to reduce the thickness of the electrically conductive contact pin to suppress stress during overdrive. However, since the cross-sectional area of the electrically conductive contact pin also decreases as the thickness thereof decreases, there is a problem that the needle pressure is lowered and the allowable time-current characteristics are deteriorated during overdrive.

In an effort to solve the above problems, technologies have been developed to form holes in electrically conductive contact pins. Examples of electrically conductive contact pins having holes are disclosed in US Patent Application Publication No. 2006-0170440, German Patent Application Publication No. 10-2008-023761, Japanese Patent Application Publication No. 2012-173263, Japanese Patent Application Publication No. 2013-007700, U.S. Pat. No. 9,702, 904, Japanese Patent Application Publication No. 6457814, and German Patent Application Publication No. 10-2017-209510.

FIG. 1 is a view illustrating an electrically conductive contact pin P having holes H according to the related art. Referring to FIG. 1, the configuration of the holes H inside the electrically conductive contact pin P for transmitting a high frequency signal makes the electrically conductive contact pin more easily elastically deformed, thereby preventing excessive needle pressure on an electrode pad.

The conventional electrically conductive contact pin P is manufactured through electroplating using a photoresist as a mold. During electroplating, the photoresist exists in an area that will later become a hole H. After electroplating, the photoresist is removed to form the hole H. At this time, since the photoresist is not properly formed or difficult to have a uniform shape when the width thereof is equal to or less than 10 μm, the photoresist which will become the hole H has to have a width of equal to or greater than 10 μm, and consequently, the hole H has a width of equal to or greater than 10 μm. Due to the limited manufacturable width of the hole H, the width design dimension of a leaf is also limited, so there is a limit to solving stress concentration caused by leaf deformation. In addition, due to the limited manufacturable width of the hole H, the strain of the electrically conductive contact pin P according to the force-displacement relationship of the electrically conductive contact pin P including a plurality of leaves is also limited.

Ends of the hole H have a round shape. This is to alleviate a stress concentration phenomenon by rounding the ends of the hole H, compared to the case where the ends of the hole H have a right-angled shape. However, when a compressive force is repeatedly applied to the electrically conductive contact pin, stress is concentrated at the round ends of the hole H, causing a problem of fatigue fracture. Therefore, there is a limit to solving the stress concentration phenomenon simply by making the shape of the ends of the hole H round.

DOCUMENTS OF RELATED ART

Patent Documents (Patent Document 1) US Patent Application Publication No. 2006-0170440

(Patent Document 2) U.S. Pat. No. 9,702,904

(Patent Document 3) Japanese Patent Application Publication No. 2012-173263

(Patent Document 4) Japanese Patent Application Publication No. 2013-007700

(Patent Document 5) Japanese Patent Application Publication No. 6457814

(Patent Document 6) German Patent Application Publication No. 10-2008-023761

(Patent Document 7) German Patent Application Publication No. 10-2017-209510

SUMMARY

Accordingly, the present disclosure has been made keeping in mind the above problems occurring in the related art, and an objective of the present disclosure is to provide an electrically conductive contact pin that prevents fatigue fracture in a hole thereof by distributing stress concentration in the hole.

In order to accomplish the above objective, the present disclosure provides an electrically conductive contact pin having a first surface, a second surface, opposite to the first surface, and a side surface connecting the first surface and the second surface to each other, the electrically conductive contact pin including a hole formed inside the electrically conductive contact pin by passing through the first and second surfaces. Here, the hole may include a center hole portion and an end hole portion communicating with the center hole portion and extending toward an end of the electrically conductive contact pin, and the end hole portion may have a smaller width than the center hole portion.

In addition, the end hole portion may include a hole width decreasing portion having a width that gradually decreases toward the end of the electrically conductive contact pin.

In addition, the end hole portion may further include a hole width constant portion communicating with the hole width decreasing portion, extending toward the end of the electrically conductive contact pin, and having a constant width.

In addition, an end of the end hole portion may have a round shape.

In addition, the end hole portion may have a width in a range of 1 μm to 10 μm.

Meanwhile, the present disclosure provides an electrically conductive contact pin having a first surface, a second surface, opposite to the first surface, and a side surface connecting the first surface and the second surface to each other, the electrically conductive contact pin including a plurality of holes formed inside the electrically conductive contact pin by passing through the first and second surfaces. Here, an inner leaf provided between two holes may include a center pillar portion and a root portion extending from the center pillar portion toward an end of the electrically conductive contact pin, and the root portion may have a larger width than the center pillar portion.

In addition, the root portion may include a leaf width increasing portion having a width that gradually increases toward the end of the electrically conductive contact pin.

In addition, the root portion may further include a leaf width constant portion extending from the leaf width increasing portion toward the end of the electrically conductive contact pin and having a constant width.

In addition, the electrically conductive contact pin may further include a fine trench formed long on a side surface of the inner leaf in a thickness direction of the electrically conductive contact pin.

In addition, the fine trench may have a depth in a range of 20 nm to 1 μm.

In addition, the root portion may have a width in a range of 1 μm to 30 μm.

Meanwhile, the present disclosure provides an electrically conductive contact pin having a first surface, a second surface, opposite to the first surface, and a side surface connecting the first surface and the second surface to each other, the electrically conductive contact pin including a plurality of leaves formed with a plurality of holes interposed therebetween along a longitudinal direction of the electrically conductive contact pin. Here, the leaves may include an outer leaf provided outside each of the holes and an inner leaf provided between the holes, the inner leaf may include a center pillar portion and a root portion extending from the center pillar portion toward an end of the electrically conductive contact pin, and the root portion may have a larger width than the center pillar portion.

In addition, the electrically conductive contact pin may further include a fine trench formed long on a side surface of each of the outer leaf and the inner leaf in a thickness direction of the electrically conductive contact pin.

The present disclosure provides an electrically conductive contact pin that prevents fatigue fracture in a hole thereof by distributing stress concentration in the hole.

DESCRIPTION OF THE EMBODIMENTS

Figure 1:
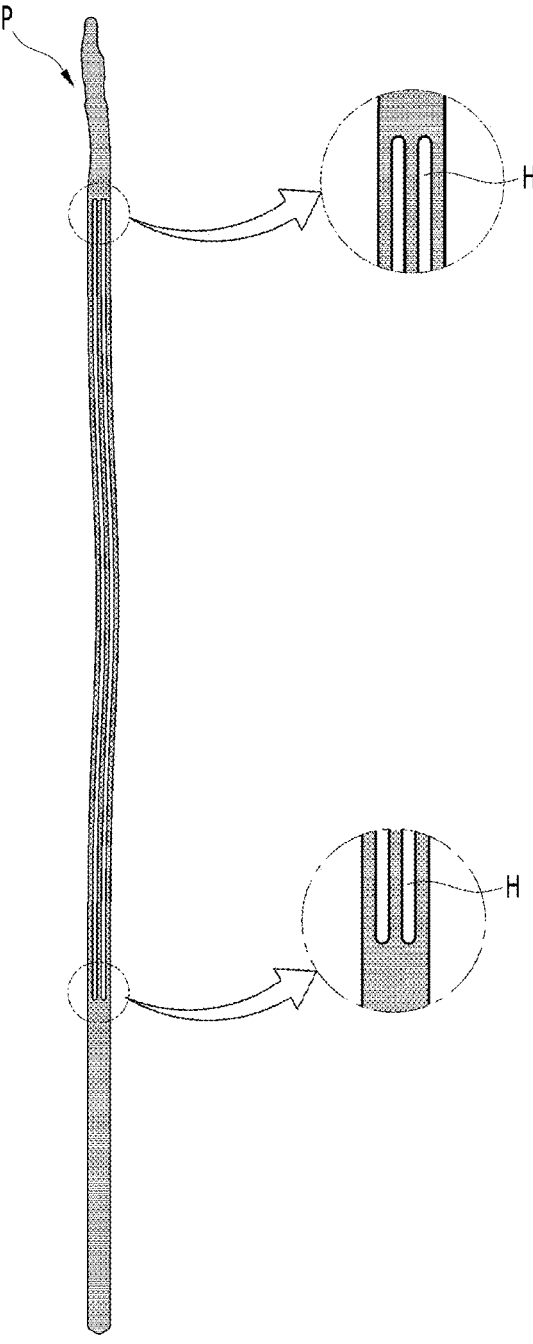
FIG. 1 is a view illustrating an electrically conductive contact pin having holes according to the related art.

Contents of the description below merely exemplify the principle of the present disclosure. Therefore, those of ordinary skill in the art may implement the theory of the present disclosure and invent various apparatuses which are included within the concept and the scope of the present disclosure even though it is not clearly explained or illustrated in the description. Furthermore, in principle, all the conditional terms and embodiments listed in this description are clearly intended for the purpose of understanding the concept of the present disclosure, and one should understand that the present disclosure is not limited to the exemplary embodiments and the conditions.

The above described objectives, features, and advantages will be more apparent through the following detailed description related to the accompanying drawings, and thus those of ordinary skill in the art may easily implement the technical spirit of the present disclosure.

The embodiments of the present disclosure will be described with reference to cross-sectional views and/or perspective views which schematically illustrate ideal embodiments of the present disclosure. For explicit and convenient description of the technical content, sizes or thicknesses of films and regions in the figures may be exaggerated. Therefore, variations from the shapes of the illustrations as a result, for example, of manufacturing techniques and/or tolerances, are to be expected. In addition, a limited number of molding products are illustrated in the drawings by way of example. Thus, the embodiments should not be construed as limited to the particular shapes of regions illustrated herein but are to include deviations in shapes that result, for example, from manufacturing.

Wherever possible, the same reference numerals will be used throughout different embodiments and the description to refer to the same or like elements or parts. In addition, the configuration and operation already described in other embodiments will be omitted for convenience.

An electrically conductive contact pin 100 according to an embodiment of the present disclosure is provided in an inspection apparatus and is used to transmit electrical signals by making electrical and physical contact with an object to be inspected. The inspection apparatus includes the electrically conductive contact pin 100 that makes contact with the object to be inspected. The inspection apparatus may be an inspection apparatus used in a semiconductor manufacturing process, for example, a probe card or a test socket. However, the inspection apparatus according to the embodiment of the present disclosure is not limited thereto, and includes any apparatus for checking whether an object to be inspected is defective by applying electricity.

The electrically conductive contact pin according to the embodiment of the present disclosure may be an electrically conductive contact pin that can transmit a signal having a frequency greater than 1 GHz. The electrically conductive contact pin may be formed to have a total length of equal to or less than 10 mm.

A body portion of the electrically conductive contact pin 100 may be made of a conductive material. Here, the conductive material may be at least one selected from the group consisting of platinum (Pt), rhodium (Rh), palladium (Pd), copper (Cu), silver (Ag), gold (Au), iridium (Ir), and an alloy of these metals, or the group consisting of a nickel-cobalt (NiCo) alloy, a palladium-cobalt (PdCo) alloy, a palladium-nickel (PdNi) alloy, and a nickel-phosphorus (NiP) alloy. The body portion of the electrically conductive contact pin 100 may have a multilayer structure in which a plurality of conductive materials are stacked. The material of each of the conductive layers made of different materials may be selected from the group consisting of platinum (Pt), rhodium (Rh), palladium (Pd), copper (Cu), silver (Ag), gold (Au), iridium (Ir), and an alloy of these metals, or the group consisting of a palladium-cobalt (PdCo) alloy, a palladium-nickel (PdNi) alloy, and a nickel-phosphorus (NiP) alloy. As one embodiment, the body portion of the electrically conductive contact pin 100 may have a multilayer structure in which first to fourth conductive layers are stacked. Here, the first conductive layer may be made of a platinum (Pt), the second conductive layer may be made of rhodium (Rh), the third conductive layer may be made of palladium (Pd), and the fourth conductive layer may be made of a nickel-cobalt (NiCo) alloy.

Meanwhile, the body portion of the electrically conductive contact pin 100 may further include an outer coating layer. The outer coating layer may be made of a material having a higher hardness than the inner conductive materials. As one embodiment, the material of the outer coating layer may be at least one selected from the group consisting of rhodium (Rh), platinum (Pt), iridium (Ir), and an alloy of these metals, or the group consisting of a nickel-cobalt (NiCo) alloy, a palladium-cobalt (PdCo) alloy, a palladium-nickel (PdNi) alloy, and a nickel-phosphorus (NiP) alloy.

The body portion of the electrically conductive contact pin 100 has a rectangular cross-section. In this case, guide holes of an upper guide plate and a lower guide plate may have a rectangular cross-section corresponding to the cross-sectional shape of the body portion. With the configuration of the rectangular cross-section body portion and the rectangular cross-section guide holes, the electrically conductive contact pin 100 can be prevented from rotating within the guide holes and interfering with adjacent contact pins 100, thereby realizing a narrow pitch.

The electrically conductive contact pin 100 has a first surface 110, a second surface (not illustrated) opposite to the first surface 110, and a side surface 130 connecting the first surface 110 and the second surface (not illustrated) to each other. The electrically conductive contact pin 100 includes a hole 200 formed in the form of an empty space inside the electrically conductive contact pin 100 by passing through the first surface 110 and the second surface (not illustrated).

By including the hole 200 formed inside the electrically conductive contact pin 100, it is possible to secure the cross-sectional area of the electrically conductive contact pin 100 even when the thickness of the electrically conductive contact pin 100 is thin. As a result, the total length can be shortened while securing the desired overdrive amount and securing the desired needle pressure or allowable time-current characteristics. That is, since the total length of the electrically conductive contact pin 100 can be shortened, the inductance of the electrically conductive contact pin 100 can be reduced and thus high frequency characteristics can be improved.

In addition, the hole 200 has an end hole portion 230 having a smaller width than a center hole portion 210, and a leaf L has a root portion 330 having a larger width than a center pillar portion 310. With this structure, stress concentration occurring at ends of a hole H according to the related art can be solved.

Hereinafter, an electrically conductive contact pin according to a first embodiment of the present disclosure will be described with reference to FIGS. 2 to 4.

Figure 2:
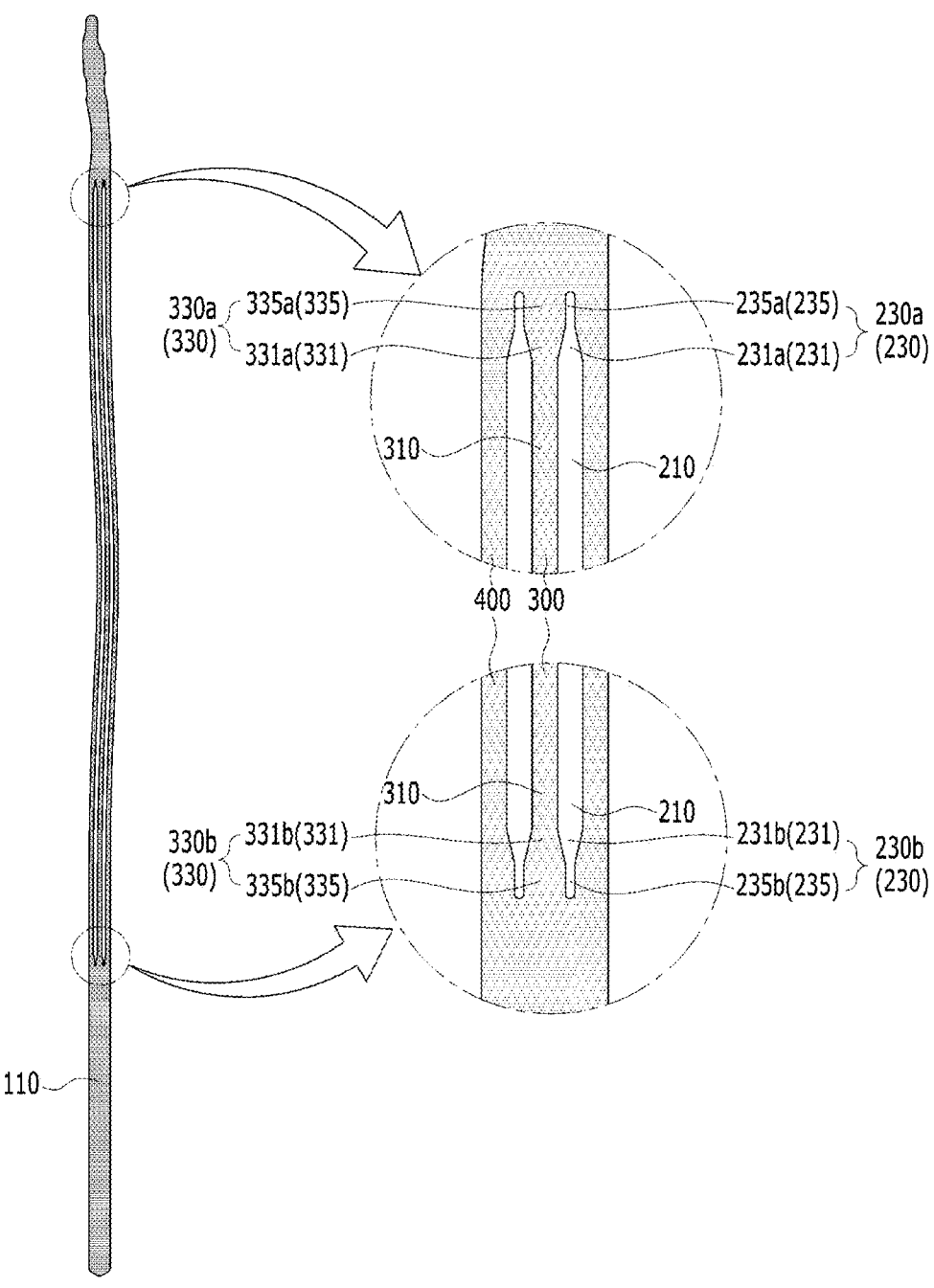
FIGS. 2 and 3 are views illustrating an electrically conductive contact pin having holes according to a first embodiment of the present disclosure.

Referring to FIG. 2, two holes 200 are illustrated. However, the number of the holes 200 is not limited thereto, and may be one or three or more.

Each of the holes 200 includes a center hole portion 210, and an end hole portion 230 communicating with the center hole portion 210 and extending toward an end of the electrically conductive contact pin 100.

The center hole portion 210 is formed to extend long vertically from the center of the longitudinal direction of the electrically conductive contact pin 100. The length of the width of the center hole portion 210 is substantially uniform over the total length of the electrically conductive contact pin in the longitudinal direction.

The end hole portion 230 is formed in communication with the center hole portion 210 and has a smaller width than the center hole portion 210. An end of the end hole portion 230 has a round shape.

At least one end hole portion 230 may be formed at an upper side or a lower side of the center hole portion 210. Preferably, the end hole portion 230 includes a first end hole portion 230a provided at the upper side of the center hole portion 210 and a second end hole portion 230b provided at the lower side of the center hole portion 210. The first end hole portion 230a and the second end hole portion 230b have a smaller width than the center hole portion 210.

Figure 3:
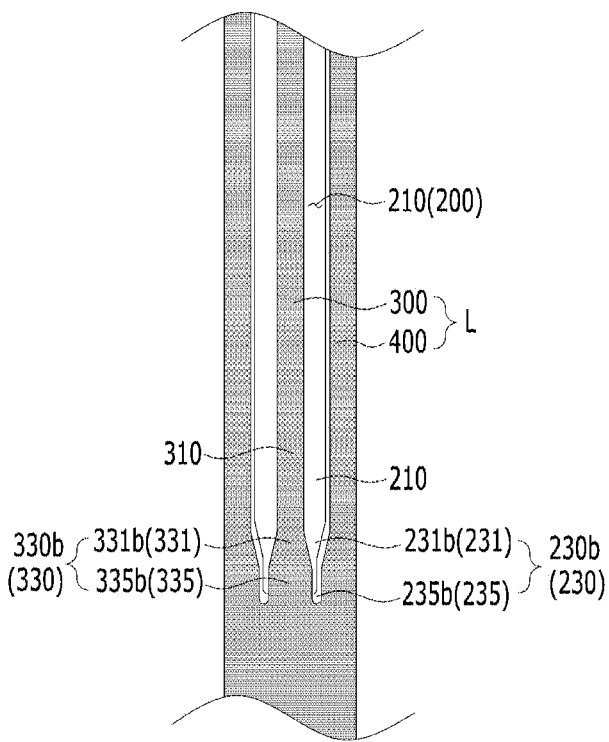

Referring to FIGS. 2 and 3, the end hole portion 230 includes a hole width decreasing portion 231 having a width that gradually decreases toward the end of the electrically conductive contact pin 100, and a hole width constant portion 235 communicating with the hole width decreasing portion 231, extending toward the end of the electrically conductive contact pin 100, and having a constant width.

The hole width decreasing portion 231 is formed such that the width thereof decreases in proportion to the longitudinal direction toward the end of the electrically conductive contact pin 100. The hole width constant portion 235 is formed such that an end thereof communicates with the hole width decreasing portion 231 and the width thereof is constant in the longitudinal direction. The hole width decreasing portion 231 is formed between the center hole portion 210 and the hole width constant portion 235 and functions to distribute stress concentration at an end of the center hole portion 210 toward the hole width constant portion 235.

The first end hole portion 230a includes a first hole width decreasing portion 231a having a width that gradually decreases toward the end of the electrically conductive contact pin 100, and a first hole width constant portion 235a communicating with the first hole width decreasing portion 231a, extending toward the end of the electrically conductive contact pin 100, and having a constant width. An end of the first hole width constant portion 235a is closed while having a round shape.

In addition, the second end hole portion 230b includes a second hole width decreasing portion 231b having a width that gradually decreases toward the end of the electrically conductive contact pin 100, and a second hole width constant portion 235b communicating with the second hole width decreasing portion 231b, extending toward the end of the electrically conductive contact pin 100, and having a constant width. An end of the second hole width constant portion 235b is closed while having a round shape.

As the electrically conductive contact pin 100 is formed to include the holes 200, the electrically conductive contact pin 100 includes a plurality of leaves L formed with the holes 200 interposed therebetween.

At least two holes 200 may be formed in the electrically conductive contact pin 100. In this case, the holes 200 may be provided side by side in the same shape in the width direction of the electrically conductive contact pin 100. The leaves L are formed in a number greater than the number of the holes 200 by one. As illustrated in FIGS. 2 and 3, when two holes 200 are formed, three leaves L are formed. When three or more leaves L are formed, the leaves L include an outer leaf 400 and an inner leaf 300. The outer leaf 400 is a leaf with at least one of its side surfaces being each side surface of the electrically conductive contact pin 100. The inner leaf 300 is a leaf with opposite side surfaces facing the holes 200.

The leaves L of the electrically conductive contact pin 100 include the outer leaf 400 provided outside each of the holes 200 and the inner leaf 300 provided between the holes. Referring to FIGS. 2 and 3, the electrically conductive contact pin 100 includes two outer leaves 400 and one inner leaf 300 provided between the two outer leaves 400.

The inner leaf 300 provided between the two holes includes a center pillar portion 310, and a root portion 330 extending from the center pillar portion 310 toward the end of the electrically conductive contact pin 100. The center pillar portion 310 is formed to extend long vertically from the center of the longitudinal direction of the electrically conductive contact pin 100. The length of the width of the center pillar portion 310 is substantially constant over the total length of the electrically conductive contact pin in the longitudinal direction.

The root portion 330 is formed to be connected to the center pillar portion 310 and has a larger width than the center pillar portion 310.

The root portion 330 includes a leaf width increasing portion 331 having a width that gradually increases toward the end of the electrically conductive contact pin 100, and a leaf width constant portion 335 extending from the leaf width increasing portion 331 toward the end of the electrically conductive contact pin 100 and having a constant width.

The width of the root portion 330 may be in the range of 1 μm to 30 μm. The leaf width increasing portion 331 may be formed such that the width thereof gradually increase toward the end of the electrically conductive contact pin 100 to a maximum of 30 μm. The leaf width constant portion 335 may be formed such that the width thereof is the same as the maximum width of the leaf width increasing portion 331 (e.g., 30 μm).

At least one root portion 330 may be formed at an upper side or a lower side of the center pillar portion 310. Preferably, the root portion 330 includes a first root portion 330a provided at the upper side of the center pillar portion 310 and a second root portion 330b provided at the lower side of the center pillar portion 310. The first root portion 330a and the second root portion 330b have a larger width than the center pillar portion 310.

Referring to FIGS. 2 and 3, the root portion 330 includes the leaf width increasing portion 331 having a width that gradually increases toward the end of the electrically conductive contact pin 100, and the leaf width constant portion 335 connected to the leaf width increasing portion 331, extending toward the end of the electrically conductive contact pin 100, and having a constant width.

The leaf width increasing portion 331 is formed such that the width thereof increases in proportion to the longitudinal direction toward the end of the electrically conductive contact pin 100. The leaf width constant portion 335 is formed such that an end thereof is connected to the leaf width increasing portion 331 and the width thereof is constant in the longitudinal direction. The leaf width increasing portion 331 is formed between the center pillar portion 310 and the leaf width constant portion 335 and functions to distribute stress concentration at an end of the center pillar portion 310 toward the leaf width constant portion 335.

The first root portion 330a includes a first leaf width increasing portion 331a having a width that gradually increases toward the end of the electrically conductive contact pin 100, and a first leaf width constant portion 335a connected to the first leaf width increasing portion 331a, extending toward the end of the electrically conductive contact pin 100 and having a constant width.

In addition, the second root portion 330b includes a second leaf width increasing portion 331b having a width that gradually increases toward the end of the electrically conductive contact pin 100, and a second leaf width constant portion 335b connected to the second leaf width increasing portion 331b, extending toward the end of the electrically conductive contact pin 100 and having a constant width.

Figure 4:
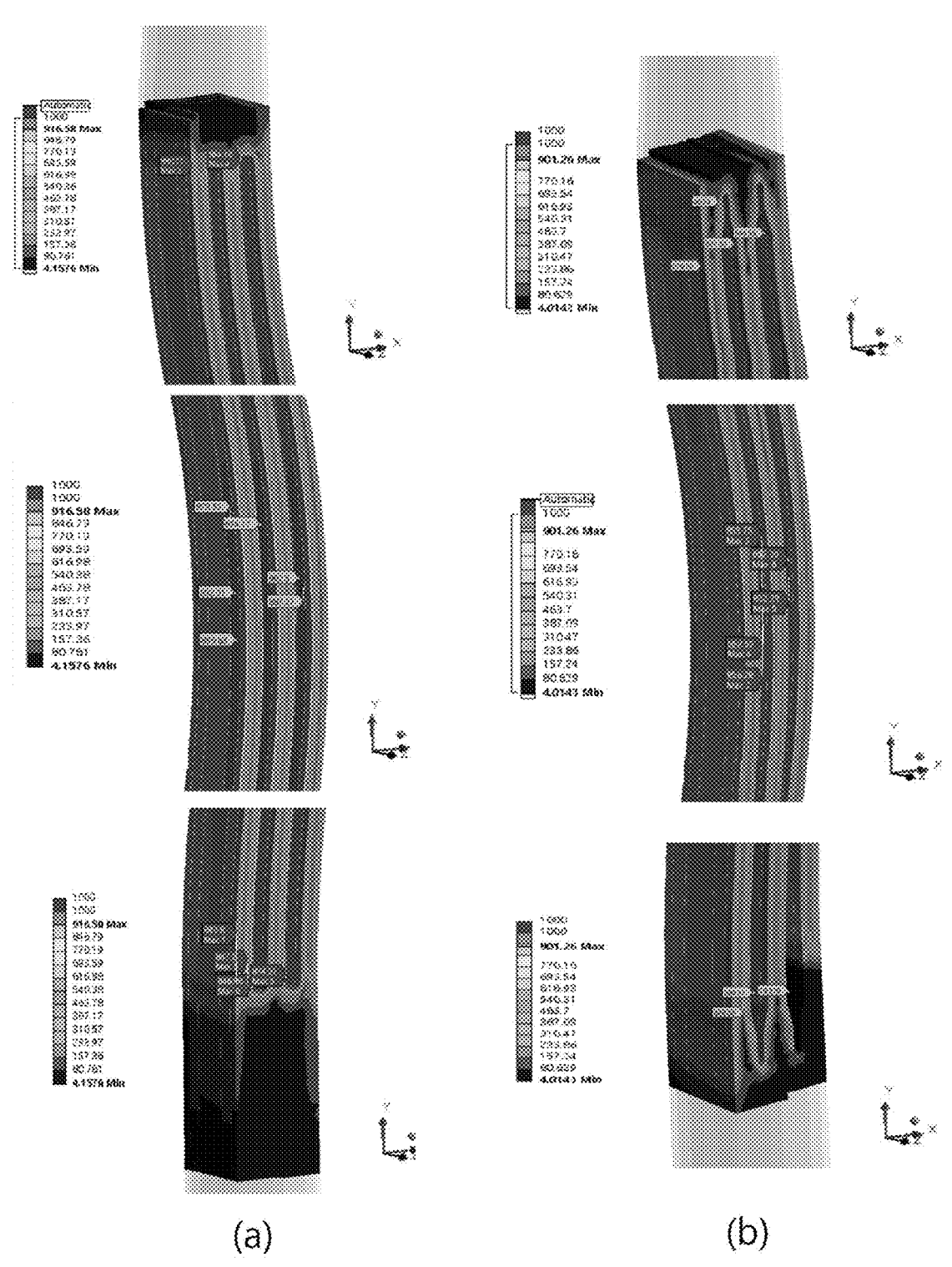
FIG. 4 is a view illustrating stress analysis results of the electrically conductive contact pin according to the related art and the electrically conductive contact pin according to the first embodiment of the present disclosure.

Referring to FIG. 4, FIG. 4a is a stress analysis result of an electrically conductive contact pin P having holes H according to the related art, and FIG. 4b is a stress analysis result of the electrically conductive contact pin 100 having the holes 200 according to the first embodiment of the present disclosure.

In the related-art electrically conductive contact pin P illustrated in FIG. 4a, as the width of leaves L changes rapidly at the ends of the holes H, the end areas of the holes H become areas where mechanical stress is concentrated. This increases the possibility of breakage of the leaves L in the end areas of the holes H. On the other hand, in the electrically conductive contact pin 100 according to the first embodiment of the present disclosure illustrated in FIG. 4b, as the width of the leaves L slowly changes at the ends of the holes 200, relieve the stress concentration phenomenon is relieved, thereby significantly reducing the possibility of breakage of the leaves L.

Hereinafter, an electrically conductive contact pin according to a second embodiment of the present disclosure will be described with reference to FIGS. 5 to 6. However, the embodiments described below will be mainly described in terms of characteristic elements in comparison with the first embodiment, and descriptions of the same or similar elements to the first embodiment will be omitted.

Figure 5:
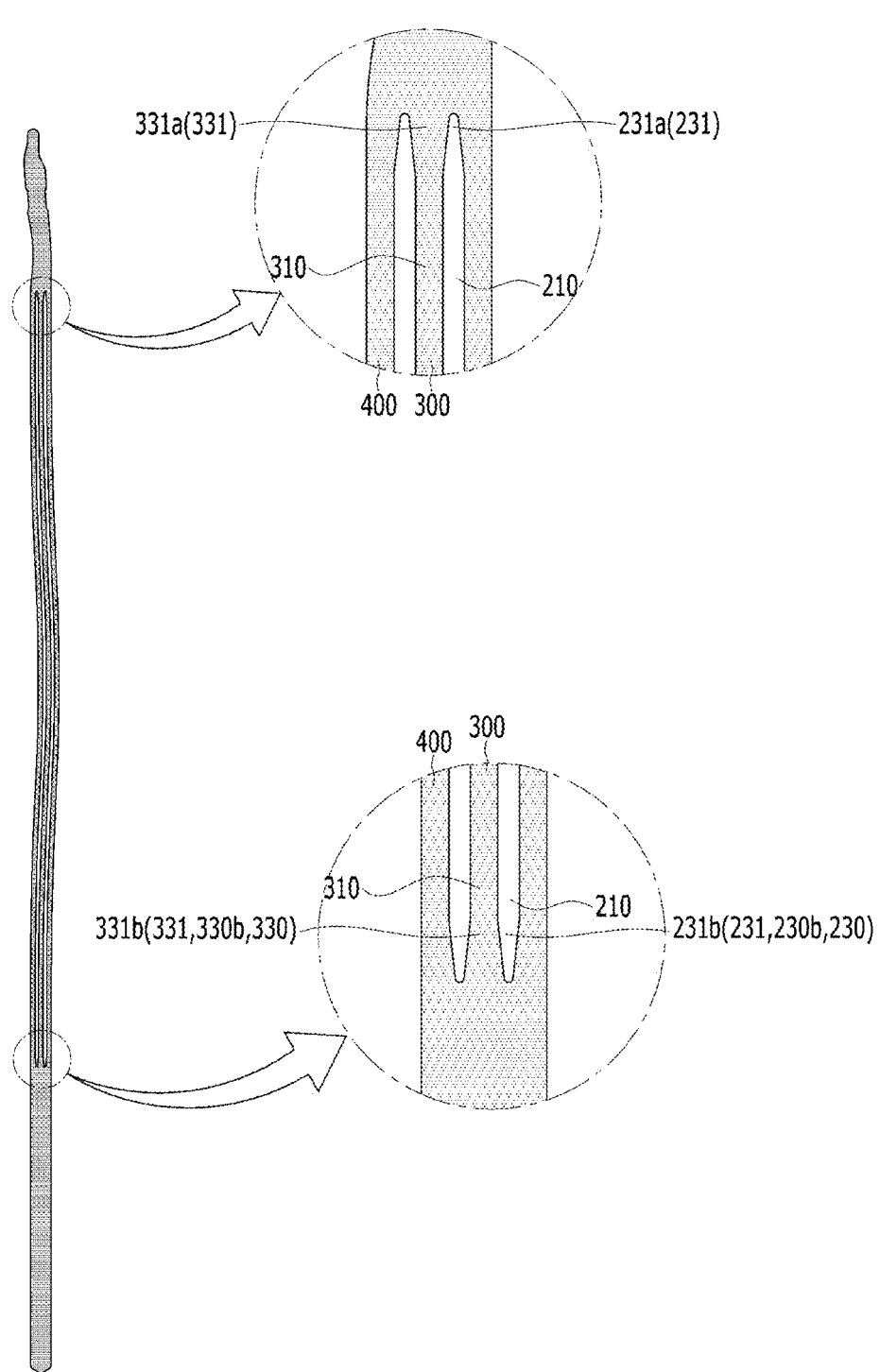
FIGS. 5 and 6 are views illustrating an electrically conductive contact pin having holes according to a second embodiment of the present disclosure.
Figure 6:
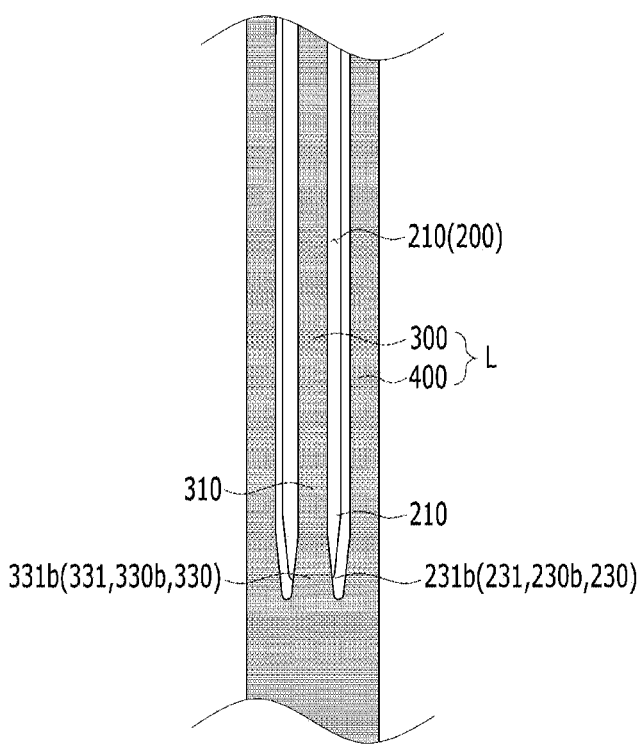

Referring to FIGS. 5 and 6, each hole 200 includes a center hole portion 210, and an end hole portion 230 communicating with the center hole portion 210 and extending toward an end of the electrically conductive contact pin 100.

The center hole portion 210 is formed to extend long vertically from the center of the longitudinal direction of the electrically conductive contact pin 100. The length of the width of the center hole portion 210 is substantially uniform over the total length of the electrically conductive contact pin in the longitudinal direction.

The end hole portion 230 is formed in communication with the center hole portion 210 and has a smaller width than the center hole portion 210.

At least one end hole portion 230 may be formed at an upper side or a lower side of the center hole portion 210. Preferably, the end hole portion 230 includes a first end hole portion 230a provided at the upper side of the center hole portion 210 and a second end hole portion 230b provided at the lower side of the center hole portion 210. The first end hole portion 230a and the second end hole portion 230b have a smaller width than the center hole portion 210.

The end hole portion 230 includes a hole width decreasing portion 231 having a width that gradually decreases toward the end of the electrically conductive contact pin 100. The hole width decreasing portion 231 is formed such that the width thereof decreases in proportion to the longitudinal direction toward the end of the electrically conductive contact pin 100.

The first end hole portion 230a includes a first hole width decreasing portion 231a having a width that gradually decreases toward the end of the electrically conductive contact pin 100. The second end hole portion 230b includes a second hole width decreasing portion 231b having a width that gradually decreases toward the end of the electrically conductive contact pin 100.

As the electrically conductive contact pin 100 is formed to include the holes 200, the electrically conductive contact pin 100 includes a plurality of leaves L formed with the holes 200 interposed therebetween. An inner leaf 300 provided between two holes includes a center pillar portion 310, and a root portion 330 extending from the center pillar portion 310 toward an end of the electrically conductive contact pin 100. The center pillar portion 310 is formed to extend long vertically from the center of the longitudinal direction of the electrically conductive contact pin 100. The length of the width of the center pillar portion 310 is substantially constant over the total length of the electrically conductive contact pin in the longitudinal direction.

The root portion 330 is formed to be connected to the center pillar portion 310 and has a larger width than the center pillar portion 310. The root portion 330 includes a leaf width increasing portion 331 having a width that gradually increases toward the end of the electrically conductive contact pin 100. The width of the root portion 330 may be in the range of 1 μm to 30 μm. The leaf width increasing portion 331 is formed such that the width thereof gradually increases toward the end of the electrically conductive contact pin 100 to a maximum of 30 μm.

At least one root portion 330 may be formed at an upper side or a lower side of the center pillar portion 310. Preferably, the root portion 330 includes a first root portion 330a provided at the upper side of the center pillar portion 310 and a second root portion 330b provided at the lower side of the center pillar portion 310. The first root portion 330a and the second root portion 330b have a larger width than the center pillar portion 310.

The first root portion 330a includes a first leaf width increasing portion 331a having a width that gradually increases toward the end of the electrically conductive contact pin 100. The second root portion 330b includes a second leaf width increasing portion 331b having a width that gradually increases toward the end of the electrically conductive contact pin 100.

Figure 7:
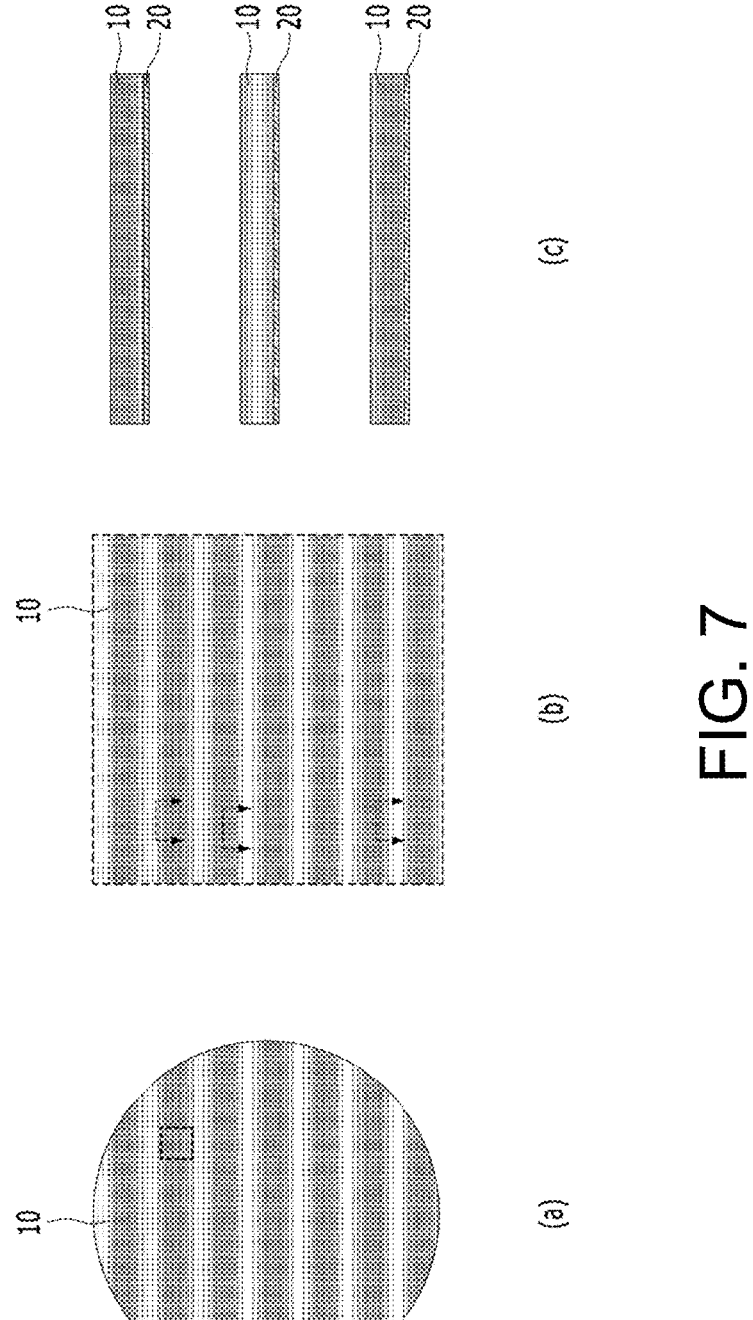
FIGS. 7 to 9 are views illustrating a method of manufacturing an electrically conductive contact pin according to an embodiment of the present disclosure.
Figure 8:
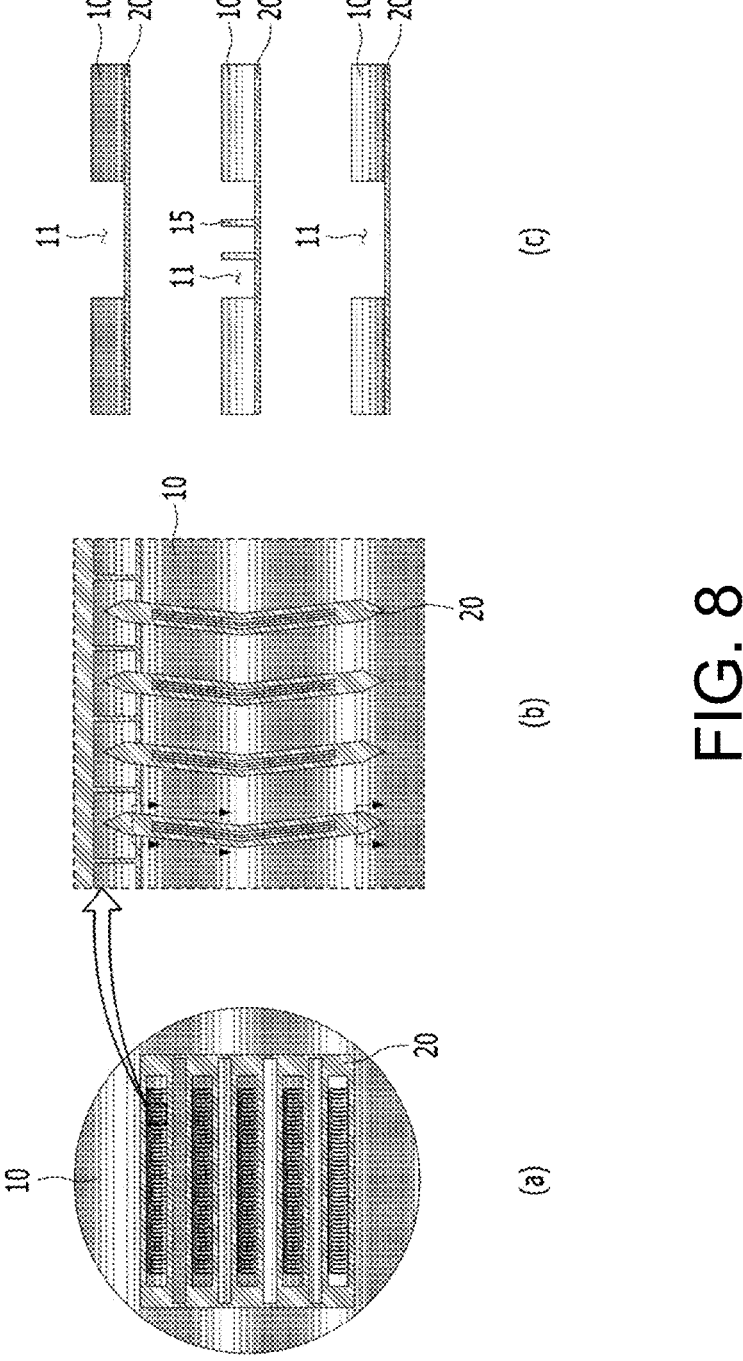
Figure 9:
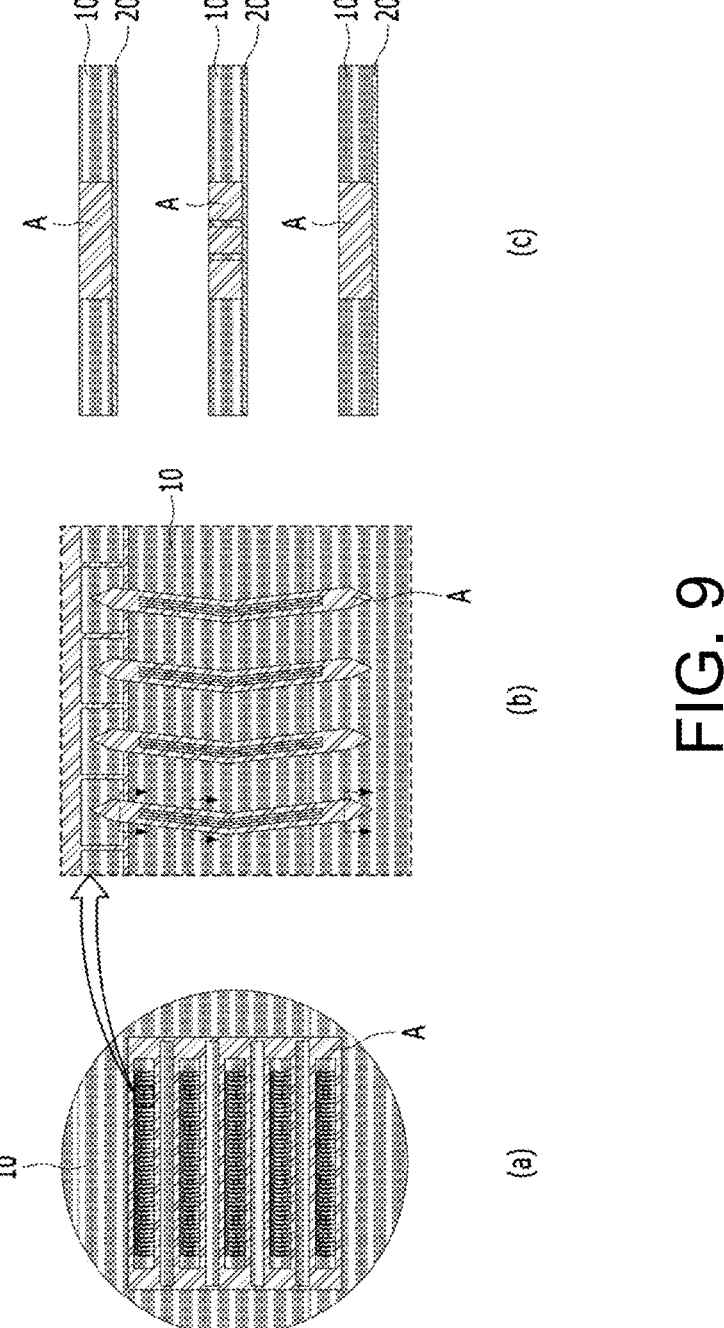

Hereinafter, a method of manufacturing the electrically conductive contact pins according to the first and second embodiments of the present disclosure will be described with reference to FIGS. 7 to 9. In the drawings, the end hole portion 230 of the hole 200 and the root portion 330 are omitted for convenience of illustration.

Referring to FIGS. 7a to 7c, FIG. 7a is a plan view illustrating an anodic aluminum oxide plate 10, FIG. 7b is an enlarged view of a portion of FIG. 7a, and FIG. 7c is a sectional view illustrating a first end portion 111, an intermediate portion 112, and a second end portion 113 illustrated in FIG. 7b.

As illustrated in FIGS. 7a to 7c, a step of providing a seed layer 20 on one surface of the anodic aluminum oxide plate 10 made of an anodic aluminum oxide film is performed. The anodic aluminum oxide plate 10 may be made of the anodic aluminum oxide film. The anodic aluminum oxide film means a film formed by anodizing a metal as a base material, and pores mean holes formed in the process of forming the anodic aluminum oxide film by anodizing the metal. For example, when the metal as the base material is aluminum (Al) or an aluminum alloy, the anodization of the base material forms the anodic aluminum oxide film consisting of anodized aluminum ($Al_2O_3$) on a surface of the base material. The resulting anodic aluminum oxide film includes a barrier layer in which no pores are formed therein vertically, and a porous layer in which pores are formed therein. After removing the base material on which the anodic aluminum oxide film having the barrier layer and the porous layer is formed, only the anodic aluminum oxide film consisting of anodized aluminum ($Al_2O_3$) remains.

The anodic aluminum oxide film may have a structure in which the barrier layer formed during the anodization is removed to expose the top and bottom of the pores, or a structure in which the barrier layer formed during the anodization remains to close one of the top and bottom of the pores.

The anodic aluminum oxide film has a coefficient of thermal expansion of 2 to 3 ppm/° C. With this range, the anodic aluminum oxide film only undergoes a small amount of thermal deformation due to temperature when exposed to a high temperature environment. Thus, even when the electrically conductive contact pin 100 is manufactured in a high temperature environment, a precise electrically conductive contact pin 100 can be manufactured without thermal deformation.

Using the anodic aluminum oxide plate 10 made of the anodic aluminum oxide film instead of using a silicon wafer can improve the accuracy of the shape of a plating layer A, and can help easily achieve selective etching of the anodic aluminum oxide film using an etchant.

The seed layer 20 is provided on one surface of the anodic aluminum oxide plate 10. The seed layer 20 may be made of copper (Cu), and may be formed by a deposition method. The seed layer 20 is used to improve the plating quality of the plating layer A when the plating layer A is formed using an electroplating method.

Next, referring to FIGS. 8a to 8c, FIG. 8a is a plan view illustrating the anodic aluminum oxide plate 10, FIG. 8b is an enlarged view of a portion of FIG. 8a, and FIG. 8c is a sectional view illustrating the first end portion 111, the intermediate portion 112, and the second end portion 113 illustrated in FIG. 8b.

As illustrated in FIGS. 8a to 8c, a step of forming openings 11 by etching at least portions of the anodic aluminum oxide plate 10 is performed. The overall shape of the openings 11 corresponds to the shape of an electrically conductive contact pin module. The openings 11 are formed in an area corresponding to a support frame of the electrically conductive contact pin module and an area corresponding to electrically conductive contact pins 100.

Islands 15 made of the anodic aluminum oxide film are provided inside each of the openings 11 in the area corresponding to the electrically conductive contact pins 100. The islands are areas where the anodic aluminum oxide film remains without being removed when the opening 11 is formed by etching a portion of the anodic aluminum oxide plate 10, and are anodic aluminum oxide film areas surrounded by the opening 11. The anodic aluminum oxide plate 10 may have a thickness in the range of 50 μm to 100 μm.

The openings 11 are formed by etching the anodic aluminum oxide plate 10. To this end, a photoresist may be provided on an upper surface of the anodic aluminum oxide plate 10 and patterned, and then the anodic aluminum oxide film in patterned and open areas may react with an etchant to form the openings 11. In detail, after a photosensitive material is provided on the upper surface of the anodic aluminum oxide plate 10 in a state before the openings 11 are formed, exposure and development processes may be performed. At least portions of the photosensitive material may be patterned and removed to form open areas through the exposure and development processes. Here, the photosensitive material remains on the areas that will later become the islands 15 without being removed. As a result of etching the anodic aluminum oxide plate 10 through the open areas where the photosensitive material is removed by the patterning process, the anodic aluminum oxide film around the areas that will later become the islands 15 is removed by the etchant to form the openings 11.

The shapes of the openings 10 and the islands 15 may be determined according to the shape of a pattern resulting from patterning the photosensitive material provided on the upper surface of the anodic aluminum oxide plate 10. The photosensitive material is not limited in dimensions and shapes of the areas to be patterned. Since the openings 11 and the islands 15 are formed by patterning the photosensitive material and etching the anodic aluminum oxide plate 10 through the areas removed by the patterning process, there is no limitation on the dimensions and shapes of the openings 11 and the islands 15. Each of the openings 11 later forms a pin body 110 of an electrically conductive contact pin 100. Since the openings 11 and the islands 15 are formed through the etching of the anodic aluminum oxide film as described above, the width of the pin body 110 including the width of holes 115 may be in the range of 20 μm to 100 μm, the width of the holes 115 may be in the range of 1 μm to 50 μm within the width range of the pin body 110, and the total length of the electrically conductive contact pin 100 may be in the range of 1 mm to 10 mm.

An opening formed by a processing method using a laser or drill mainly has a circular cross-section or is formed in a shape that does not include a corner where surfaces meet. In addition, since the processing method using the laser or drill is difficult to form minute holes, and holes have to be formed at pitch intervals P considering mechanical errors, there are limitations on their dimension and shape. However, according to the embodiment of the present disclosure, the openings 11 may have angled corners, and the openings 11 can be formed without limiting their shape.

In addition, when the anodic aluminum oxide plate 10 is wet-etched with an etchant, openings 11 having vertical inner walls are formed. Therefore, pin bodies 110 of the electrically conductive contact pins 100 have a rectangular longitudinal vertical section.

The anodic aluminum oxide plate 10 may be formed with a thickness in the range of 10 μm to 150 μm. In the case of using a photoresist mold instead of the anodic aluminum oxide plate 10, it is difficult to precisely and quickly manufacture openings having vertical side surfaces because the openings have to be formed in a thick photoresist through an exposure process. This method has limitations on increasing the thickness of the photoresist mold to equal to or greater than 70 μm. On the other hand, when the openings 11 are formed using the anodic aluminum oxide plate 10, the openings 11 having the vertical side surfaces can be formed precisely and quickly even when the thickness of the anodic aluminum oxide plate 10 is equal to or greater than 70 μm.

As described above, forming the plating layer A using the anodic aluminum oxide film as a mold as compared to using the photoresist as a mold can improve the accuracy of the shape of the plating layer A, so that pin bodies 110 having a precise microstructure can be manufactured.

Next, referring to FIGS. 9a to 9c, FIG. 9a is a plan view illustrating the anodic aluminum oxide plate 10, FIG. 9b is an enlarged view of a portion of FIG. 9a, and FIG. 9c is a sectional view illustrating the first end portion 111, the intermediate portion 112, and the second end portion 113 illustrated in FIG. 9b.

As illustrated in FIGS. 9a to 9c, a step of forming the plating layer A in the openings 11 by plating is performed. During electroplating, the plating layer A is formed using the seed layer 20. After the plating process is completed, a planarization process is performed. The plating layer A protruding from the upper surface of the anodic aluminum oxide plate 10 is removed and planarized through a chemical mechanical polishing (CMP) process.

Then, the anodic aluminum oxide plate 10 and the seed layer 20 are removed, thereby obtaining the electrically conductive contact pins 100 according to the embodiment of the present disclosure. At this time, islands 15 made of the anodic aluminum oxide film of the anodic aluminum oxide plate 10 are removed together to form holes 200.

Since the electrically conductive contact pins 100 according to the first and second embodiments of the present disclosure described above are manufactured by using the anodic aluminum oxide plate 10 as a mold, a plurality of fine trenches 88 are formed on at least one surface of the electrically conductive contact pin 100.

Figure 10:
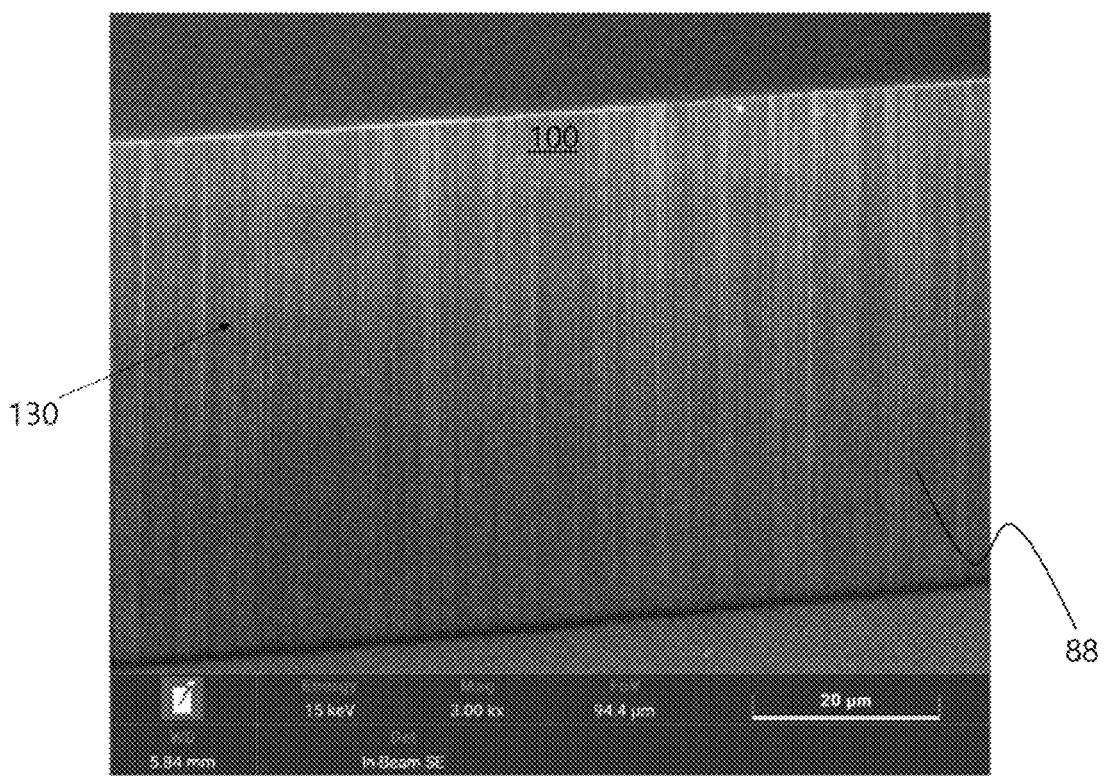
FIG. 10 is an image illustrating a side surface of the electrically conductive contact pin according to the embodiment of the present disclosure.

Referring to FIG. 10, on a side surface 130 of the electrically conductive contact pin 100, the fine trenches 88 are formed in a long groove shape extending in the thickness direction of the electrically conductive contact pin 100. Here, the thickness direction of the electrically conductive contact pin 100 means a direction in which the plating layer A grows during electroplating. The fine trenches 88 are formed on the entire side surface 130 of the electrically conductive contact pin 100, but are not formed on the upper surface and the lower surface except for the side surface 130.

The fine trenches 88 have a depth in the range of 20 nm to 1 μm and a width in the range of 20 nm to 1 μm. Here, because the fine trenches 88 are resulted from the formation of pores formed during the manufacture of the anodic aluminum oxide plate 10, the width and depth of the fine trenches 88 are equal or less than the diameter of the pores formed in the anodic aluminum oxide plate 10. On the other hand, in the process of forming the openings 11 in the anodic aluminum oxide plate 10, portions of the pores of the anodic aluminum oxide plate 10 may be crushed by an etchant to at least partially form a fine trench 88 having a depth greater than the diameter of the pores formed during the anodization.

Since the anodic aluminum oxide plate 10 includes a large number of pores, at least portions of the anodic aluminum oxide plate 10 are etched to form the openings 11, and the plating layer A is formed in the openings 11 by electroplating, the fine trenches 88 are formed on the side surface 130 of the electrically conductive contact pin 100 as a result of contact between the electrically conductive contact pin 100 and the pores of the anodic aluminum oxide plate 10.

The electrically conductive contact pin 100 includes a hole 200 formed inside the electrically conductive contact pin 100 by passing through the first surface 110 and the second surface (not illustrated). The configuration of the hole 200 may be the same as that of the above-described embodiments. In this case, a fine trench 88 formed long in the thickness direction of the electrically conductive contact pin 100 is also provided on a side surface 130 constituting the hole 200. The fine trench 88 is resulted from the formation of the islands 15 formed during the manufacture of an anodic aluminum oxide mold 200.

Due to the configuration of the hole 200, the electrically conductive contact pin 100 includes an outer leaf 400 and an inner leaf 300. Each of the outer leaf 400 and the inner leaf 300 includes a fine trench 88 formed long in a side surface thereof in the thickness direction of the electrically conductive contact pin 100.

In the electrically conductive contact pin 100, the roughness range of the side surface 130 is different from those of the first surface 110 and the second surface (not illustrated). According to the configuration in which a large number of fine trenches 88 having a width and depth of several tens of nanometers are formed, the roughness range of the side surface 130 of the electrically conductive contact pin 100 is greater than those of the first surface 110 and the second surface (not illustrated) of the electrically conductive contact pin 100.

The fine trenches 88 as described above can contribute to increasing the surface area of the side surface 130 of the electrically conductive contact pin 100. In other words, even when the electrically conductive contact pin 100 according to the embodiment of the present disclosure has the same shape and dimensions as a conventional electrically conductive contact pin, the surface area of the side surface 130 of the electrically conductive contact pin 100 can be increased.

In addition, with the configuration of the fine trenches 88 formed on the side surface 130 of the electrically conductive contact pin 100, the torsional resistance ability of the electrically conductive contact pin 100 against deformation can be improved. During overdrive, the electrically conductive contact pin 100 slides in contact with an inner surface of a guide hole of a guide plate in the bending direction or in the opposite direction. When the electrically conductive contact pin 100 receives a torsional load, the fine trenches 88 provided on the side surface 130 of the electrically conductive contact pin 100 to be parallel to a pressing surface enable the electrically conductive contact pin 100 to withstand twisting. This prevents twisting of the electrically conductive contact pin 100 from occurring and prevents a contact surface from being reduced during sliding, thereby minimizing generation of cutting foreign substances on the side surface.

In addition, with the configuration of the fine trenches 88 formed on the side surface 130 of the electrically conductive contact pin 100, the elastic restoration ability of the electrically conductive contact pin 100 against deformation can be improved.

In addition, with the configuration of the fine trenches 88, heat generated in the electrically conductive contact pin 100 can be rapidly dissipated, thereby suppressing a rise in the temperature of the electrically conductive contact pin 100.

In addition, with the configuration of the fine trenches 88 provided on the side surface of each end of the electrically conductive contact pin 100 in contact with a contact object, the contact resistance of the electrically conductive contact pin 100 can be reduced upon contact with the contact object. In addition, when the electrically conductive contact pin 100 slides up and down in contact with the guide hole of the guide plate, the fine trenches 88 provided on the side surface of the electrically conductive contact pin 100 reduce the frictional resistance of the electrically conductive contact pin 100 with the guide hole, thereby enabling efficient sliding.

The conventional electrically conductive contact pin P is manufactured through electroplating using a photoresist as a mold. During electroplating, the photoresist exists in an area that will later become a hole H. After electroplating, the photoresist is removed to form the hole H. At this time, the photoresist is not properly formed or difficult to have a uniform shape when the width thereof is equal to or less than 10 μm. Therefore, the photoresist which will become the hole H has to have a width of equal to or greater than 10 μm, and consequently, the hole H has a width of equal to or greater than 10 μm.

On the other hand, according to the embodiment of the present disclosure, since the anodic aluminum oxide plate 10 in which the openings 11 are formed is used as a mold to manufacture the electrically conductive contact pin 100, the anodic aluminum oxide plate 10 exists in the area which will become the hole 200. Therefore, it is possible to make the width of the hole 200 equal to or less 10 μm, thereby reducing limitations on the design dimension of the width of the leaf L. With this feature, the hole 200 can be formed to include the end hole portion 230 having a smaller width than the center hole portion 210, and the inner leaf 300 can be formed to include the root portion 330 having a larger width than the center pillar portion 310. This makes it possible to design the leaf L that can solve the stress concentration phenomenon occurring at the ends of the hole 200, thereby improving the durability of the electrically conductive contact pin 100.

Although the exemplary embodiments of the present disclosure have been described for illustrative purposes, those skilled in the art will appreciate that various modifications, additions, and substitutions are possible, without departing from the scope and spirit of the present disclosure as disclosed in the accompanying claims.

DESCRIPTION OF THE REFERENCE
NUMERALS IN THE DRAWINGS

100: electrically conductive contact pin
200: hole
210: center hole portion
230: end hole portion
L: leaf
300: inner leaf
400: outer leaf
500: fine trench
What is claimed is:

1. An electrically conductive contact pin having a first surface, a second surface, opposite to the first surface, and a side surface connecting the first surface and the second surface to each other, the electrically conductive contact pin comprising:

a plurality of holes formed inside the electrically conductive contact pin by passing through the first and second surfaces, wherein an inner leaf provided between two holes comprises a center pillar portion and a root portion extending from the center pillar portion toward an end of the electrically conductive contact pin, and the root portion has a larger width than the center pillar portion, wherein the electrically conductive contact pin further comprises a trench formed longitudinally on a side surface of each of the outer leaf and the inner leaf in a thickness direction of the electrically conductive contact pin.

2. The electrically conductive contact pin of claim 1, wherein each of the plurality of holes comprises a center hole portion and an end hole portion communicating with the center hole portion and extending toward an end of the electrically conductive contact pin, and the end hole portion has a smaller width than the center hole portion, wherein an end of the end hole portion has a round shape.

3. The electrically conductive contact pin of claim 1, wherein each of the plurality of holes comprises a center hole portion and an end hole portion communicating with the center hole portion and extending toward an end of the electrically conductive contact pin, and the end hole portion has a smaller width than the center hole portion, wherein the end hole portion has a width in a range of 1 m to 10 m.

4. The electrically conductive contact pin of claim 1, wherein each of the plurality of holes comprises a center hole portion and an end hole portion communicating with the center hole portion and extending toward an end of the electrically conductive contact pin, and the end hole portion has a smaller width than the center hole portion.

5. The electrically conductive contact pin of claim 1, wherein the trench has a depth in a range of 20 nm to 1 μm.

6. The electrically conductive contact pin of claim 1, wherein the root portion has a width in a range of 1 μm to 30 μm.

7. An electrically conductive contact pin having a first surface, a second surface, opposite to the first surface, and a side surface connecting the first surface and the second surface to each other, the electrically conductive contact pin comprising:

a plurality of leaves formed with a plurality of holes interposed therebetween along a longitudinal direction of the electrically conductive contact pin, wherein the leaves comprise an outer leaf provided outside each of the holes and an inner leaf provided between the holes, wherein the inner leaf comprises a center pillar portion and a root portion extending from the center pillar portion toward an end of the electrically conductive contact pin, and the portion has a larger width than the center pillar portion, wherein the electrically conductive contact pin further comprises a trench formed longitudinally on a side surface of each of the outer leaf and the inner leaf in a thickness direction of the electrically conductive contact pin.

* * * * *